(12) United States Patent
Borkowski et al.

(10) Patent No.: US 6,324,755 B1
(45) Date of Patent: Dec. 4, 2001

(54) SOLID INTERFACE MODULE (75) Inventors: Michael T. Borkowski, Westboro; Thomas V. Sikina, Acton; John W. Roman, Natick, all of MA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/596,384

(22) Filed: Jun. 16, 2000

Related U.S. Application Data (60) Provisional application No. 60/139,713, filed on Jun. 17, 1999.

(51) Int. Cl.[7] .................................................. H05K 3/34
(52) U.S. Cl. ............................. 29/840; 257/706; 29/830
(58) Field of Search ................... 343/700 MS; 361/413; 29/840; 165/80.3, 80.4, 80.5

(56) References Cited

U.S. PATENT DOCUMENTS

| | | | |
|---|---|---|---|
| 4,987,516 | * 1/1991 | Belanger, Jr. et al. | 361/413 |
| 5,132,648 | * 7/1992 | Trinh et al. | 333/128 |
| 5,239,685 | * 8/1993 | Moe et al. | 455/73 |
| 5,819,401 | 10/1998 | Johannes et al. | 29/830 |
| 5,832,598 | * 11/1998 | Greenman et al. | 29/840 |
| 6,011,446 | * 1/2000 | Woods | 331/185 |
| 6,019,165 | * 2/2000 | Batchelder | 165/80.3 |

\* cited by examiner

*Primary Examiner*—Don Wong
*Assistant Examiner*—James Clinger
(74) *Attorney, Agent, or Firm*—Daly, Crowley & Mofford, LLP (57) ABSTRACT

A microwave solid interface module having transmit and receive functionality includes a substrate supporting microwave, logic, and DC bias circuits. In one embodiment, the substrate can be formed from BeO. The module can include a BGA package that provides a connector-less interface for RF, DC, and thermal connections to a supporting module. The BGA structure provides vertical connections between the BGA solder balls and a respective DC signal layer, a microwave signal layer, and a thermally conductive core within the supporting module.

29 Claims, 10 Drawing Sheets

SOLID INTERFACE MODULE

CROSS-REFERENCE TO RELATED APPLICATIONS

This application claims priority from U.S. Provisional Patent Application No. 60/139,713, filed on Jun. 17, 1999, which is incorporated herein by reference.

STATEMENTS REGARDING FEDERALLY SPONSORED RESEARCH

Not applicable.

BACKGROUND OF THE INVENTION

As known to one of ordinary skill in the art, there has been a trend to provide increasingly complex radar and communications systems and circuits including radio frequency (RF) circuits such as transmit-receive modules. There has also been a trend to provide such systems, circuits and modules as compact, low cost systems, circuits and modules.

Conventional radar systems include array antenna systems utilizing a variety of different RF, digital and power conditioning and supply circuitry. Such circuitry typically includes, but is not limited to, transmit/receive (TR) modules, data multiplexer/demultiplexer (MUX-DEMUX) modules and DC-DC converter modules. The number of circuits or modules used in such systems results in a large number of interconnections between modules, circuits and devices. Consequently, the systems are typically large, time consuming to assemble, and expensive. This is particularly true with respect to a class of radar systems that include active electronically scanned antenna systems (AESA).

As is understood by one of ordinary skill in the art, the transmit/receive modules are an important component of an AESA system. In general , the T/R modules arc quite significant in determining radar microwave performance, cost, and interface requirements. For example, conventional T/R modules have relatively high assembly costs, are labor intensive to assemble, have limited yield rates, have significant interconnection losses, are subject to cross coupling, and have significant thermal management considerations.

It would, therefore, be desirable to provide a radar system having transmit/receive modules in the form of a solid interface module having a ball grid array structure that integrates microwave, logic and thermal connections.

SUMMARY OF THE INVENTION

The present invention provides a microwave transmit/receive (TR) assembly in the form of a solid interface module having an integrated structure that provides a relatively connector-less interface with a module on which the solid interface module is disposed. While the solid interface module of the present invention is particularly well-suited for radar systems, especially active electronically scanned antenna radar systems, it is understood that the invention is applicable in other electronic systems that utilize RF, logic and bias circuits.

In one aspect of the invention, a solid interface module in accordance with the present invention includes a substrate with a microwave circuit, a logic circuit, and a DC bias circuit disposed on the substrate. In one embodiment, the substrate is formed from Beryllium Oxide. With this particular arrangement, a microwave solid interface module having a variety of different types of circuit technologies integrated on a single substrate is provided for reducing the number of separate substrates and carrier assemblies required to provide the transmit/receive module.

In accordance with a further aspect of the present invention, the solid interface module has a ball grid array structure including a via interconnection system. In one embodiment, via structures extend from solder balls of the ball grid array to a respective layer within a module that supports the solid interface module. A portion of the vias are thermal vias that can extend from a solder ball of the ball grid array to a thermally conductive core disposed within the supporting module. The thermal vias can extend from a region of the substrate that corresponds to a location of a high power circuit, such as a power amplifier.

In another aspect of the invention, the via interconnection system includes a substantially round via hole and a substantially square pin. The pins can be coated with solder for reflowing of the solder after insertion of the pin into the via hole. This arrangement enhances the electrical or thermal pathway from the solid interface module to the supporting module.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
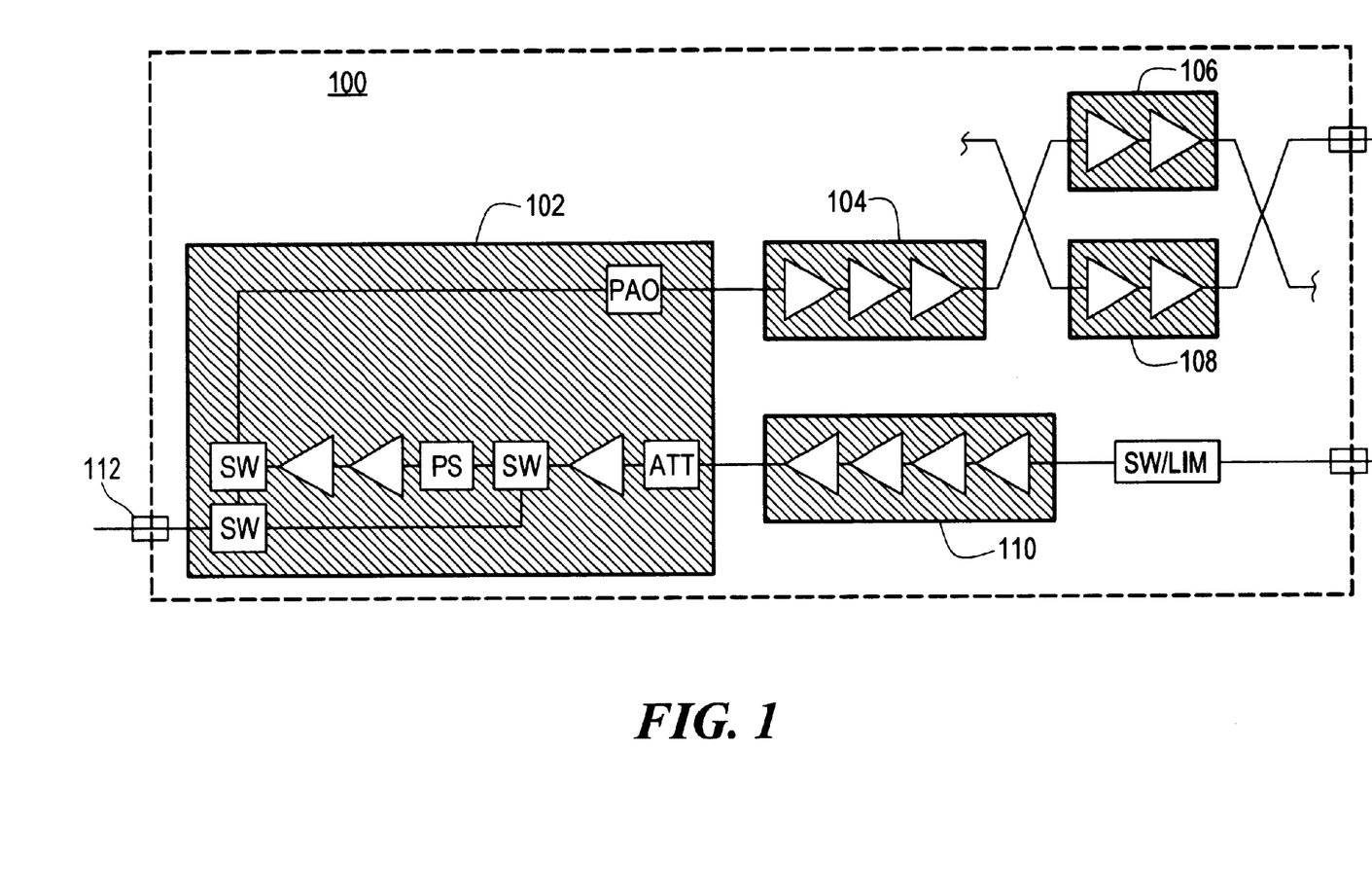
FIG. 1 is a schematic block diagram showing exemplary RF circuits on a microwave solid interface module in accordance with the present invention.

FIG. 1 shows an RF block diagram of a microwave solid interface module (SIM) 100 in accordance with the present invention that provides certain radar transmit and receive functionality. The SIM 100 includes radio frequency (RF) circuitry for transmitting signal energy to illuminate a region of space and for receiving energy scattered by a target in the illuminated region. In an exemplary embodiment, the SIM 100 transmit and receive functions are provided on five chips; a multifunction transmit/receive circuit 102; a driver amplifier 104, first and second power amplifiers 106,108 and a low noise amplifier 110.

Figure 2:
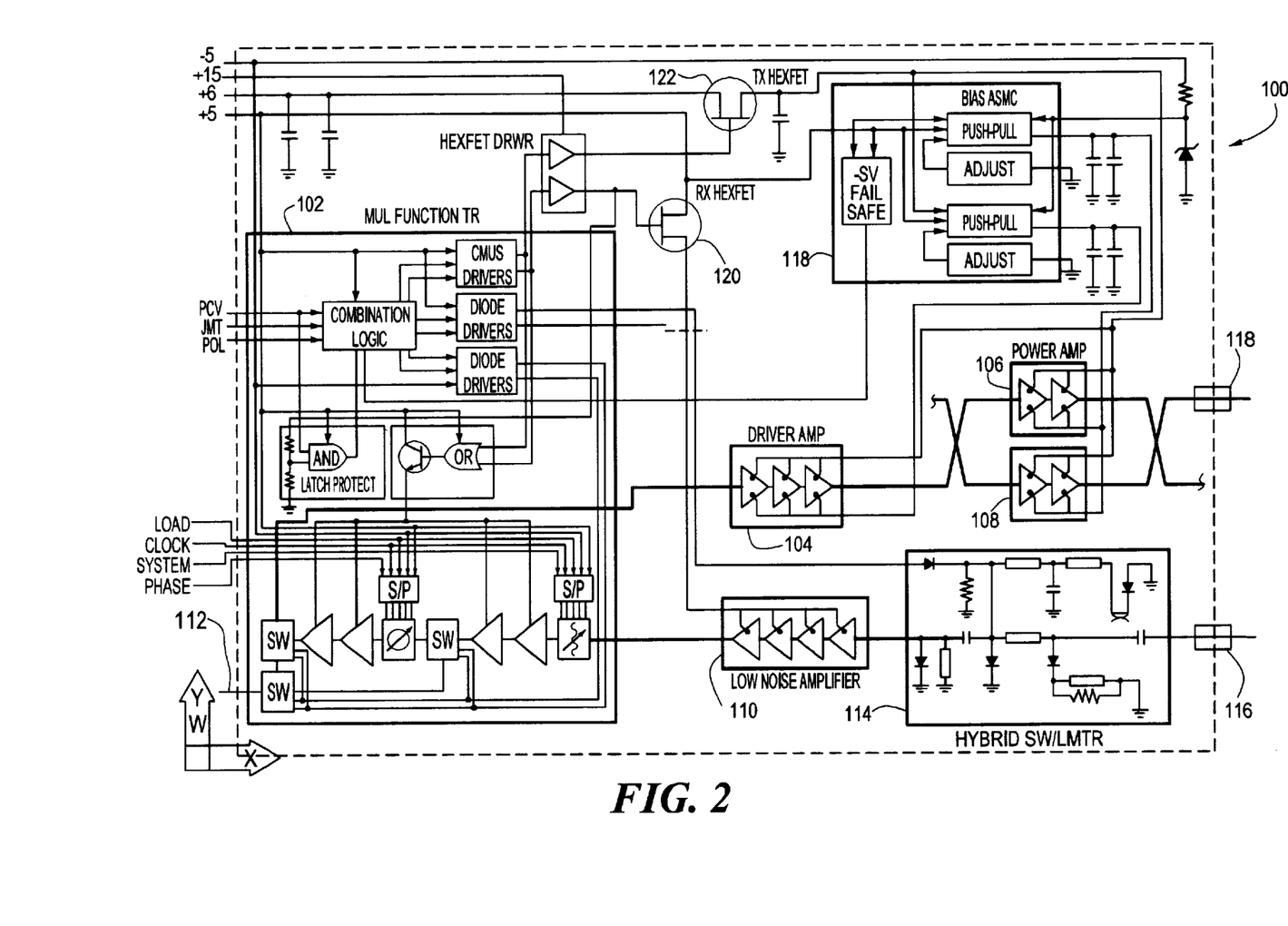
FIG. 2 is a more detailed circuit diagram of the solid interface module of FIG. 1.

FIG. 2 shows an exemplary circuit implementation of the SIM 100 of FIG. 1. The multifunction transmit/receive circuit 102 is connected to an I/O port 112, which can be a beamformer port in the transmit or receive modes. In one embodiment, an RF signal level of about +11 dBm is provided to the beamformer port. The multifunction transmit/receive circuit 102 can be provided from a so-called digital/microwave monolithic integrated circuit (D/MMIC) process allowing both microwave and digital interface circuitry. This process is well known to one of ordinary skill in the art. In general, the D/MMIC process combines logic, DC, and microwave functions into a single chip so as to require a range of design and manufacturing skills.

In one embodiment, the multifunction transmit/receive module 102 includes a seven bit phase shifter, a six bit attenuator, transmit/receive switching, and multiple gain stages. The functionality provided by the multifunction transmit/receive circuit 102 is well known to one of ordinary skill in the art.

The driver amplifier 104 is coupled to the multifunction transmit/receive circuit 102 for receiving the transmit signal after phaser/attenuation in the transmit/receive circuit. In an exemplary embodiment, the driver amplifier 104 is a three stage amplifier fabricated using 0.25 micrometer gate-length Psuedomorphic High-Electron Mobility Transistor (PHEMT) technology. The amplifier provides a power output of about 2 Watts with more than +22.0 dB of gain at efficiencies greater than about forty-five percent. The output of the driver amplifier 104 is split into in-phase and quadrature for driving the first and second power amplifiers 106, 108. The first and second amplifiers 106,108 produce a combined output signal at port 118.

The SIM 100 further includes a hybrid switch/limiter circuit 114 coupled to the low noise amplifier 110. In an exemplary embodiment, the switch/limiter 114 includes discrete silicon PIN and Schottky diodes for achieving low insertion loss and for protecting the low noise amplifier from power reflected from the antenna. The low noise amplifier 110 can be provided as a four stage amplifier having +32 dB of gain. In the receive mode, an input signal passes from a receive antenna port 116 into the switch/limiter circuitry 114, through the low noise amplifier 110, and into the multifunction transmit/receive circuit 102.

The SIM 100 can further includes a bias circuit 118 which can be provided as a GaAs ASIC, for controlling respective transmit and receive FETS 120,122 in a conventional manner.

Figure 3:
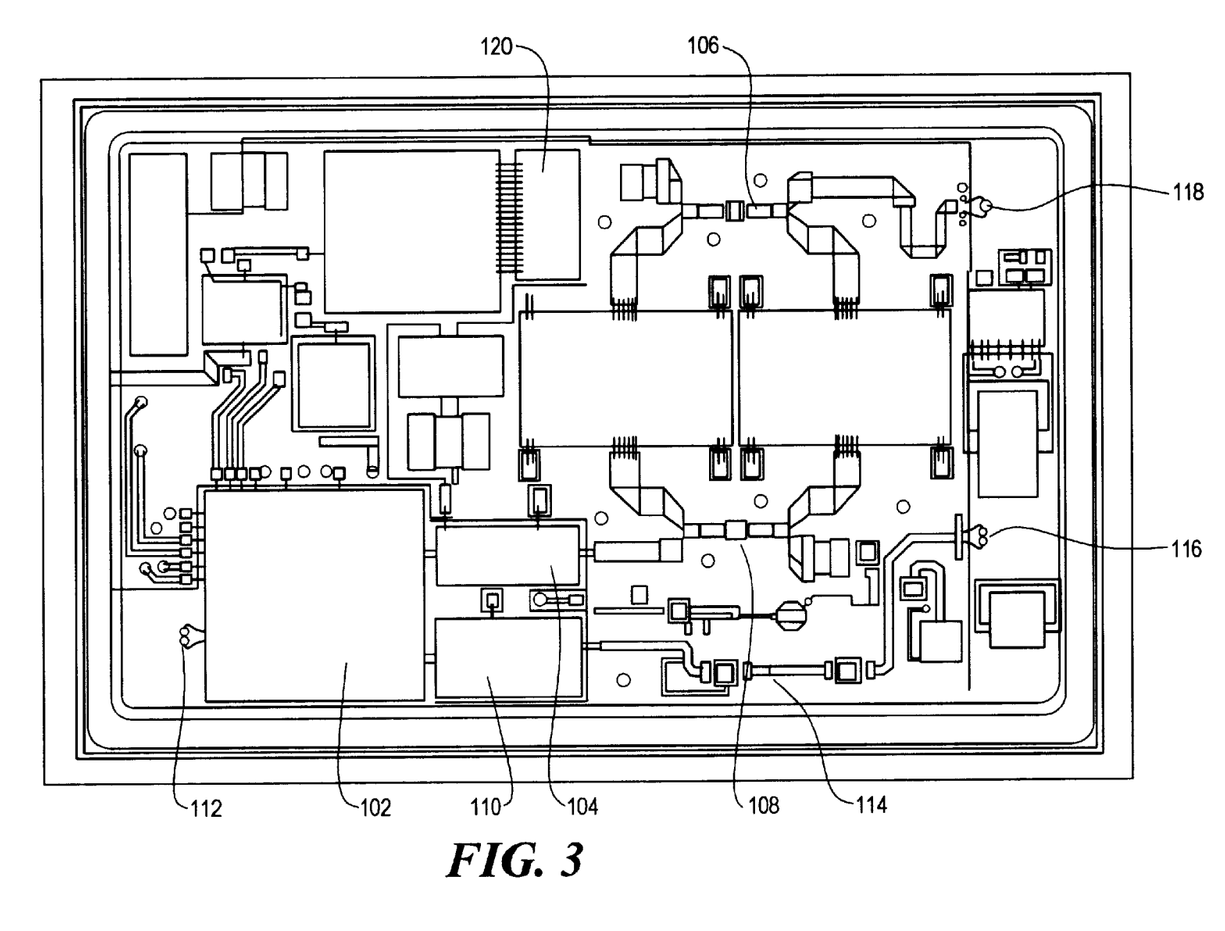
FIG. 3 is plan view of an exemplary circuit layout for the circuit of FIG. 2.

FIG. 3 shows an exemplary layout for the circuit of FIG. 2 showing the various components at exemplary locations on a module.

It is understood that the circuits described above are exemplary and that one of ordinary skill in the art can readily vary these circuits without departing from the present invention. For example, circuit partitioning among the chips can be modified. In addition, the particular characteristics of the various chips and circuit components can vary in accordance with the requirements for a particular application.

Figure 4:
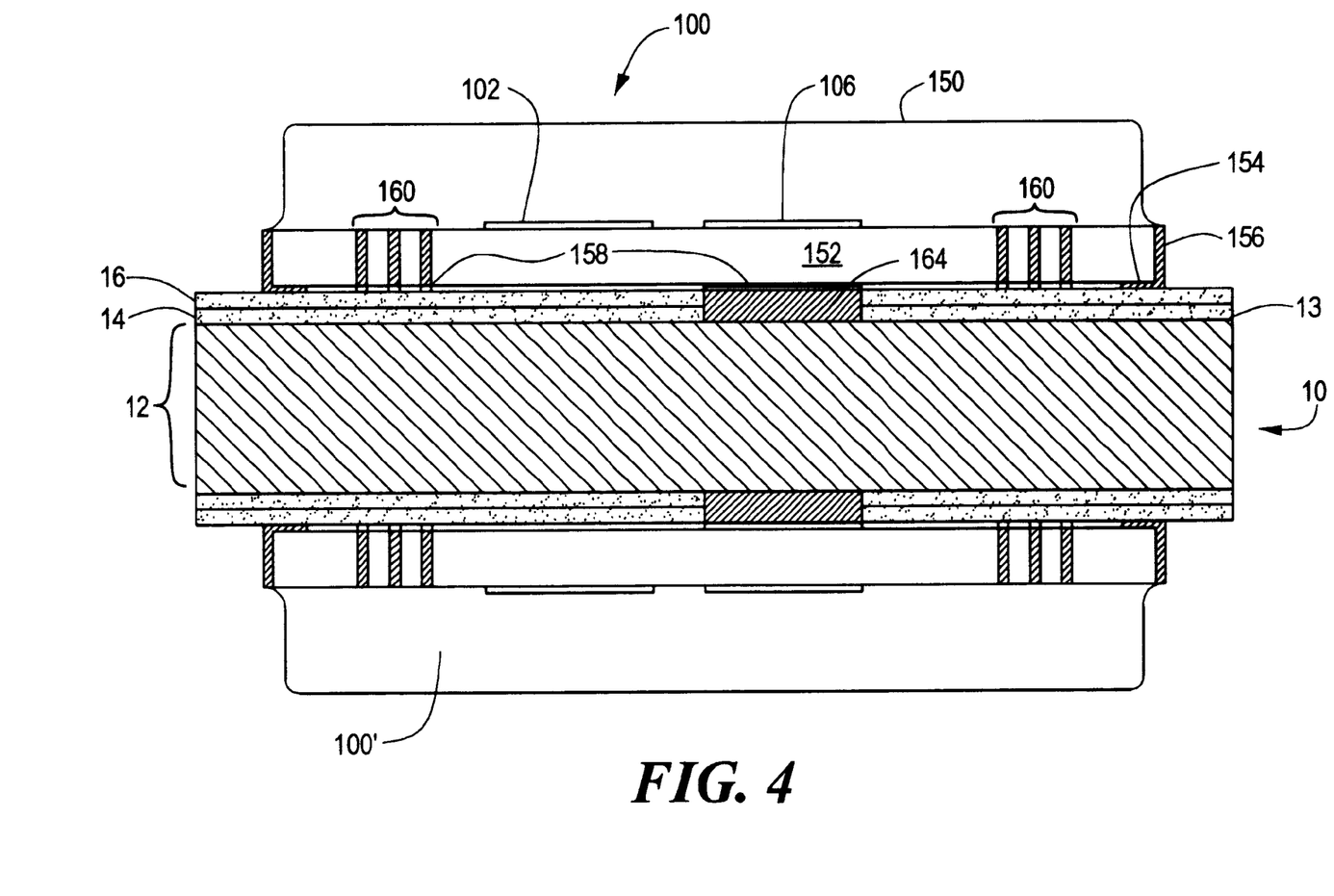
FIG. 4 is a cross-sectional view showing the solid interface module of FIG. 2 on a supporting module having a thermally conductive core.

FIG. 4 shows a cross sectional view of an exemplary SIM in accordance with the present invention, such as the SIM 100 of FIG. 2, wherein like reference numbers indicate like elements. The SIM 100 includes a cover 150 disposed over a substrate 152 which can be formed from Beryllium Oxide (BeO). The cover 150 can form an electromagnetic interference barrier. In one embodiment, the cover 150 includes a layer of plastic having a thickness of about 5 mils and a copper layer having a thickness of about 0.5 mils. The SIM circuitry including the power amplifier 106 (FIG. 1) and the multifunction transmit/receive circuit 102 are disposed on the BeO substrate 152. Edges of the SIM can be soldered at regions 154 and have copper edge plating 156.

The BeO substrate 152, which is a ceramic material, is a relatively good thermal conductor so as to spread out heat dissipated by an overlying circuit, such as the power amplifiers 106,108. The BeO substrate 152 thickness can vary from about 20 mils to about 40 mils. In an exemplary embodiment, the BeO substrate has a thickness of about 25 mils.

The SIM 100 further includes a series of vias through the BeO substrate 152 for providing a vertical launch structure that is described further below. The SIM 100 can be provided in a ball grid package (BGA) having a plurality of balls 158 disposed on a bottom of the BeO substrate for providing digitial, microwave and thermal connections.

An examplary embodiment, a series of RF ports 160 are formed in the BeO substrate 152, which are described more fully bellow. In gneneral, RF signals pass through a simulated coaxial transmission line or vertical launch 160 and exit the SIM through the BGA soldier balls.

The SIM 100 can be disposed over a circuit board carrier 10 having a core 12 formed from thermal pyrolytic graphite (TPG), which has a relatively high thermal conductivity for conducting heat away from the SIM. The carrier 10 can also include circuit layers for DC, logic, and microwave functionality. A further SIM 100' can be disposed on an opposing side of the carrier 10, as shown. The carrier core 12 can be contained within a shell of alternating conductive and insulating layers 13. The carrier can include a series of thermal vias 164 connecting BGA solder balls 158 to the TPG core for conducting heat away from the power amplifier 106, as well as circuit vias 160 connecting the SIM to selected circuits for DC, logic, and microwave functions.

The supporting carrier 10 can further include a stripline conductor layer 14 and a Duroid layer 16 over the TPG core 12 for providing electrical connectivity with the SIM 100.

Figure 5A:
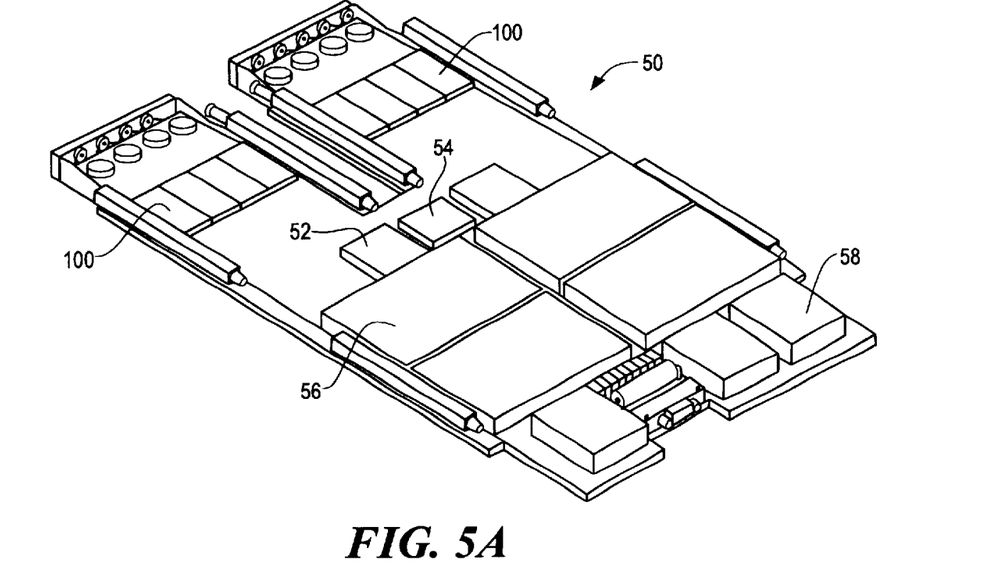
FIG. 5A is a perspective view of the supporting module of FIG. 4 on which a plurality of solid interface modules in accordance with the present invention are disposed.
Figure 5B:
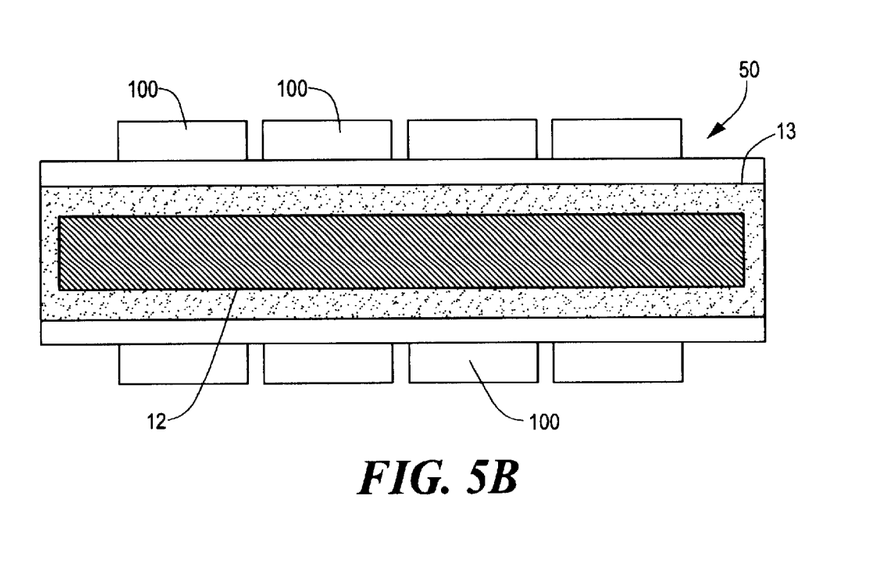
FIG. 5B is a cross-sectional view of the supporting module of FIG. 5A.

In one embodiment, shown in FIGS. 5A–B, a single line replaceable unit (LRU) circuit board carrier 50 can include sixteen SIMS 100, for example. The illustrative LRU carrier 50 that supports the SIMs can include various components such as a controller circuit 52, a data mux/demux 54, a DC-DC converter circuit 56, and high voltage capacitors 58.

Figure 6:
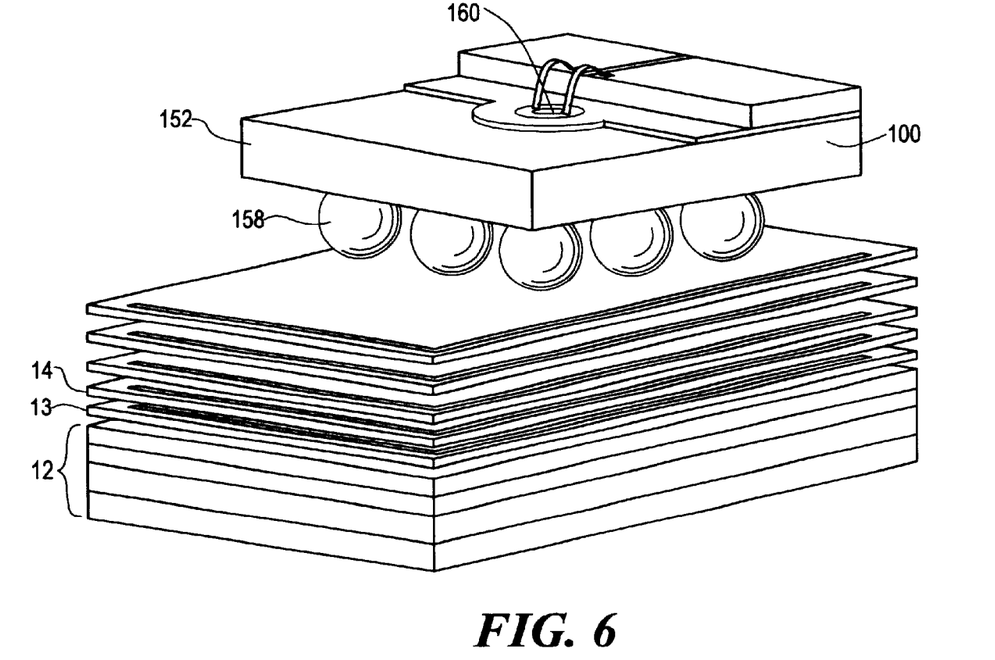
FIG. 6 is a cut-away perspective view of a solid interface module in accordance with the present invention having a ball grid array structure.

FIG. 6 shows a cutaway view of an exemplary SIM structure in accordance with the invention. The SIM interfaces 100 with a multilayer module 60 on which the SIM is disposed. The multilayer module 60 can include a stripline conductor layer 14, a shell 13, and a thermal core 12. An RF port 160, which is shown in further detail in FIGS. 9–13. connects RF circuitry to a respective one of the BGA solder balls 158 after passing through the BeO substrate 152.

It is understood that the BGA interface structure dimensions can vary. In an exemplary embodiment, the BGA includes a 0.050 in. square grid of 0.035 in. solder balls that provide the interface for signals into and out of the module, including thermal, microwave, logic, DC, and structural connections.

Figure 7:
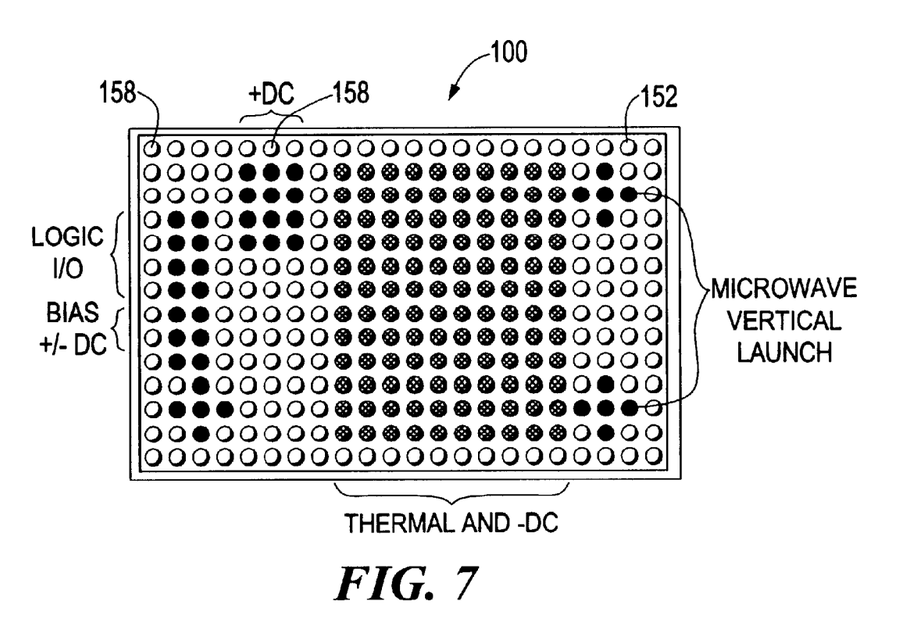
FIG. 7 is a bottom view of a solid interface module in accordance with the present invention having a ball grid array structure.

FIG. 7 shows an exemplary BGA configuration for the SIM 100 including a single-layer 25-mil thick BeO substrate 152 with a ball attachment pad structure and metallization on the bottom side and with about 7 mil filled hermetic vias from top to bottom with printed interconnection pads on the top. The BGS solder balls 158 provide a "connector-less" interface for the SIM 100. In one embodiment, the SIM has a footprint of about 0.7 inch by 1.1 inch. As shown in an exemplary configuration in FIG. 7, groups of solder balls provide logic and I/O connections, bias +/−DC, thermal and −DC, and microwave vertical launches.

Figure 8:
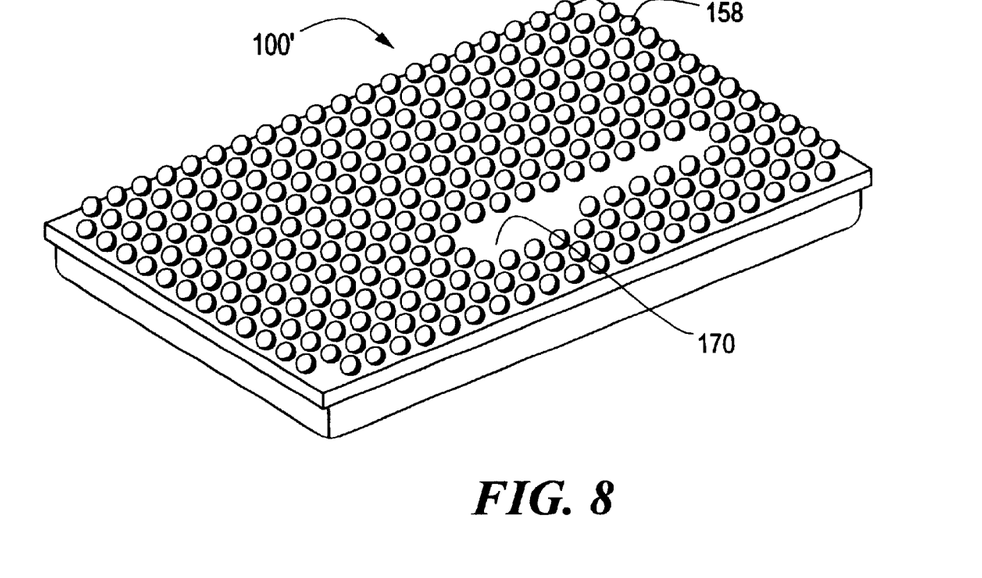
FIG. 8 is a bottom view of an alternative embodiment of a solid interface module in accordance with the present invention having a keyed ball grid array structure.

In one embodiment shown in FIG. 8, the SIM 100 BGA has a key structure 170 defined by the absence of solder balls 158 to facilitate component orientation for automated pick and place assembly.

Figure 9:
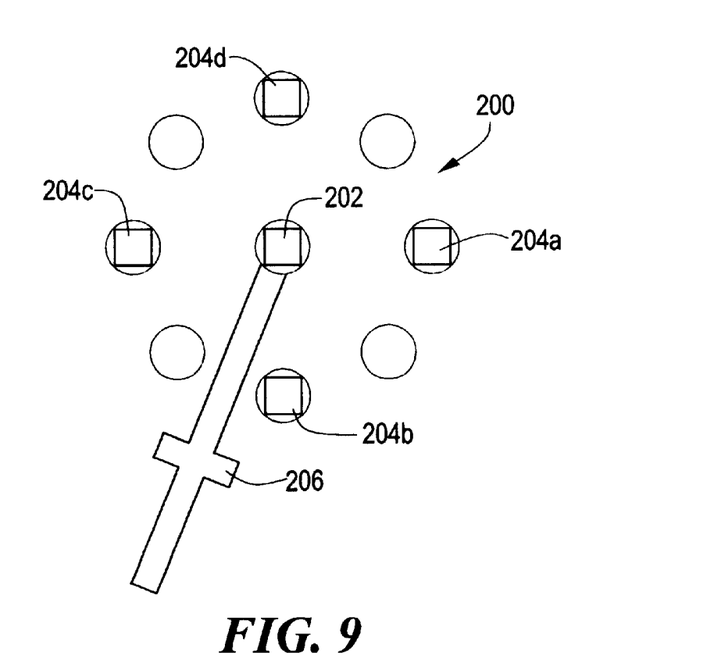
FIG. 9 is a diagrammatic representation of a via connection configuration for a solid interface module in accordance with the present invention.

FIG. 9 shows an electrical connection of the microwave signal carrying BGA solder balls 158 (FIG. 8) to a buried microwave signal carrying layer of the underlying carrier achieved with a coaxial vertical launch arrangement 200. In the illustrative embodiment the RF vertical launch from the SIM 100 to the microwave signal carrying layer 16 (see FIGS. 4, 7, and 9–13 for example) includes a center conductor via 202 and four vias 204a–d equally spaced around the circumference of a circle disposed concentrically about the center conductor via 202. This particular pattern can be selected to accommodate the grid pattern of the BGA solder balls. It will be appreciated by those of ordinary skill in the art, however, that other patterns of the center conductor via to the surrounding outer conductor vias (including the number and size of the outer conductor vias) can be readily varied to suit a particular application. As known to one of ordinary skill in the art, a tuning/impedance matching structure 206 can be utilized for optimizing the connection.

Figure 10:
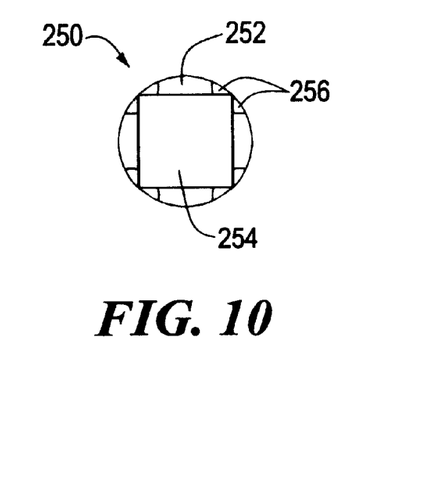
FIG. 10 is a top view of a via structure that can form a part of a solid interface module in accordance with the present invention.
Figure 11:
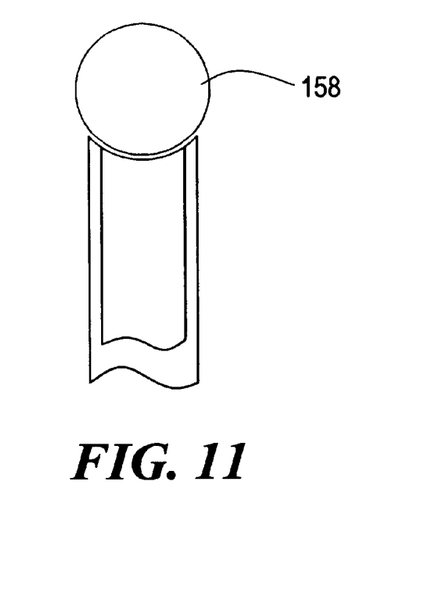
FIG. 11 is a side view of the via structure of FIG. 10.
Figure 12:
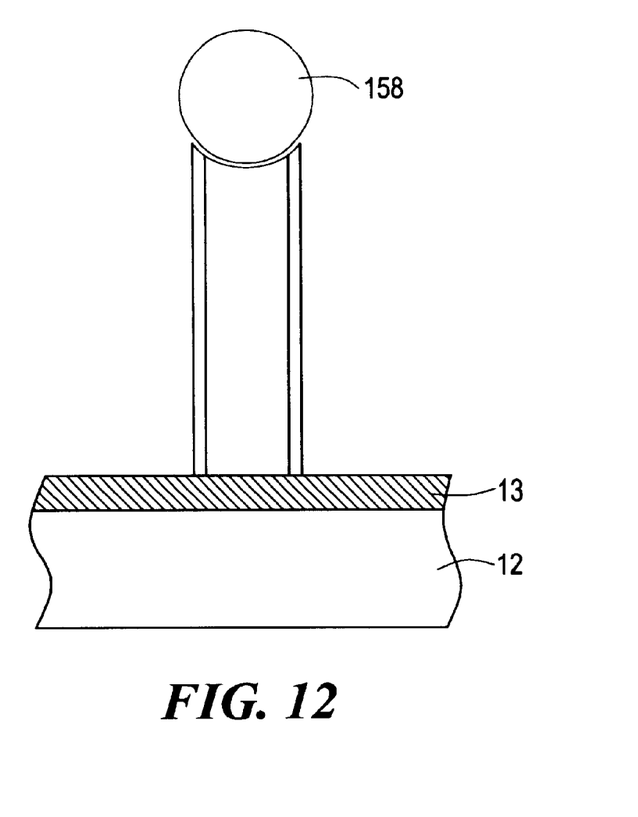
FIG. 12 is a side view showing further details of the via structure of FIG. 10B.

FIGS. 10–12 show an exemplary interface between the solder balls 158 of the BGA used for thermal or electrical conduction to via structures 250 on a carrier to which the SIM is connected, such as the module of FIG. 5A. The via structure 250 include a plated via hole 252 and a solder plated pin 254 disposed in the via hole. Thermal vias extend through the carier layers, e.g., the dielectric layers, for conducting thermal flux through a solder ball 158 to the thermally conductive TPG 12 in the module core. Electrical vias extend to a signal layer above the core. For a thermal via, the pin 254 can be coupled to the aluminum shell 13 that surrounds the TPG material 12. In one embodiment, the aluminum shell 13 is plated with 0.001 inch of copper.

In addition to forming thermal and electrical connections, the thermal and electrical vias also provide structural stability between the SIM and the carrier such that mechanical and structural forces are carried to the circuit card carrier.

In a preferred embodiment, the plated via 252 has a substantially round cross-section and the pin 254 has a substantially square cross-section. However, it will be appreciated by those of ordinary skill in the art that various cross-sectional shapes may be used.

It is understood that the overall dimensions for the vias can vary. Illustrative dimensions for the via 252 include a 15 mil diameter and 13 mil sides for the square pin, both of which can be solder plated prior to assembly. Once the pin 254 is inserted into the plated via 252, the assembly is heated to reflow the solder, thereby causing solder 256 to fill the corner areas of the square pin (see FIG. 10). This arrangement provides effective via connections for signals from DC up through the X-band frequency range. Thus, this connector-less interconnection structure allows RF, digital and DC signals to be transmitted through a multi-layer structure.

The various features of the SIM of the present invention provide advantages over conventional transmit/receive modules. For example, the BeO substrate 152 is compatible with the BGA interface, the thermal interfaces within the module, the microwave chips and transmission lines, and the logic and DC connections. The BGA interface reduces the complexity of the chip, enhances design compactness, simplifies assembly procedures, and integrates input/output (I/O). In addition, the SIM operating parameters can be readily modified to meet the requirements for a broad spectrum of radar and communication applications.

In addition, the BeO substrate has superior thermal conductivity properties, relatively low cost, good electrical isolation properties, and light weight. Further, BeO can be easily plated to facilitate chip attachment (preferably by chip and wire bonding) and, it can be drilled and plated to form vias. Also, BeO is structurally suitable to be made relatively thin. In the illustrative embodiment, the BeO substrate is on the order of 20 mils thick. BeO has a CTE on the order of 7 ppm °C., which advantageously matches the coefficient of thermal expansion of module layers, such as a Thurmount layer.

Furthermore, the BeO substrate allows for the minimization of discrete passive components such as resistors and off-MMIC bypass capacitors since these components in particular can be built into the ceramic substrate base.

In addition, vertical interconnections for both microwave and non-microwave electrical connections allow for the highest packaging density within the bounds of low-cost single-layer substrate technology. DC and logic electrical connections can employ redundant connections through the use of multiple balls for each connection. This adds significantly to the calculated mean time between failure (MTBF).

The vertical nature of the connections can allow introduction of the high-current DC bias into the SIM from directly underneath the MMIC power amplifiers, as is shown in FIG. 7, such that the parasitic resistance and inductance in the series path to the module is reduced. For a given power output level from the MMIC power amps this design feature can significantly reduce, e.g., fifty percent, unnecessary $I^2R$ drop in the module when compared with prior art designs.

The BGA feature of the SIM provides a "connectorless" microwave interface when compared with conventional coaxial and microstrip interfaces. In one embodiment, the SIM consists of a 1.1 inch by 0.7 inch beryllium oxide (BeO) base substrate with a 0.025 inch thickness, with 0.035 inch solder balls on a 0.050 inch rectangular pitch to form all of the thermal, microwave, logic electrical, and high current bias interfaces for the module.

The SIM configuration of the present invention provides significant advantages over conventional metal housings with sidewall feed-throughs for microwave multi-chip modules. For example, the SIM has a comparatively simple construction since the base substrate combines structural, thermal, and electrical functions in a cost effective, easily manufacturable part. In addition, the hermetic electrical feedthroughs, i.e., the vertical launch configuration shown in FIGS. 4, 6, and 7 for example, are an integral part of the structure, not separate brazed parts as in known devices. The SIM structure provides electrical performance advantages due to the relatively short electrical paths and the inherently gas-tight, low-loss nature of soldered connections. The combination of hermetic vias in the substrate and a simple brazed-on ring frame with no penetrations for feedthroughs allows the production of a simple, high yielding hermetic package.

Furthermore, the SIM is a surface mount part allowing straightforward, mature surface-mount technology (SMT) assembly process for the circuit card carrier on which the SIM is disposed. SMT assembly can be a highly automated process with high yield and low cost. The SIM, for all its electronic sophistication, becomes just another part that seamlessly fits into the assembly process flow.

Figure 13:
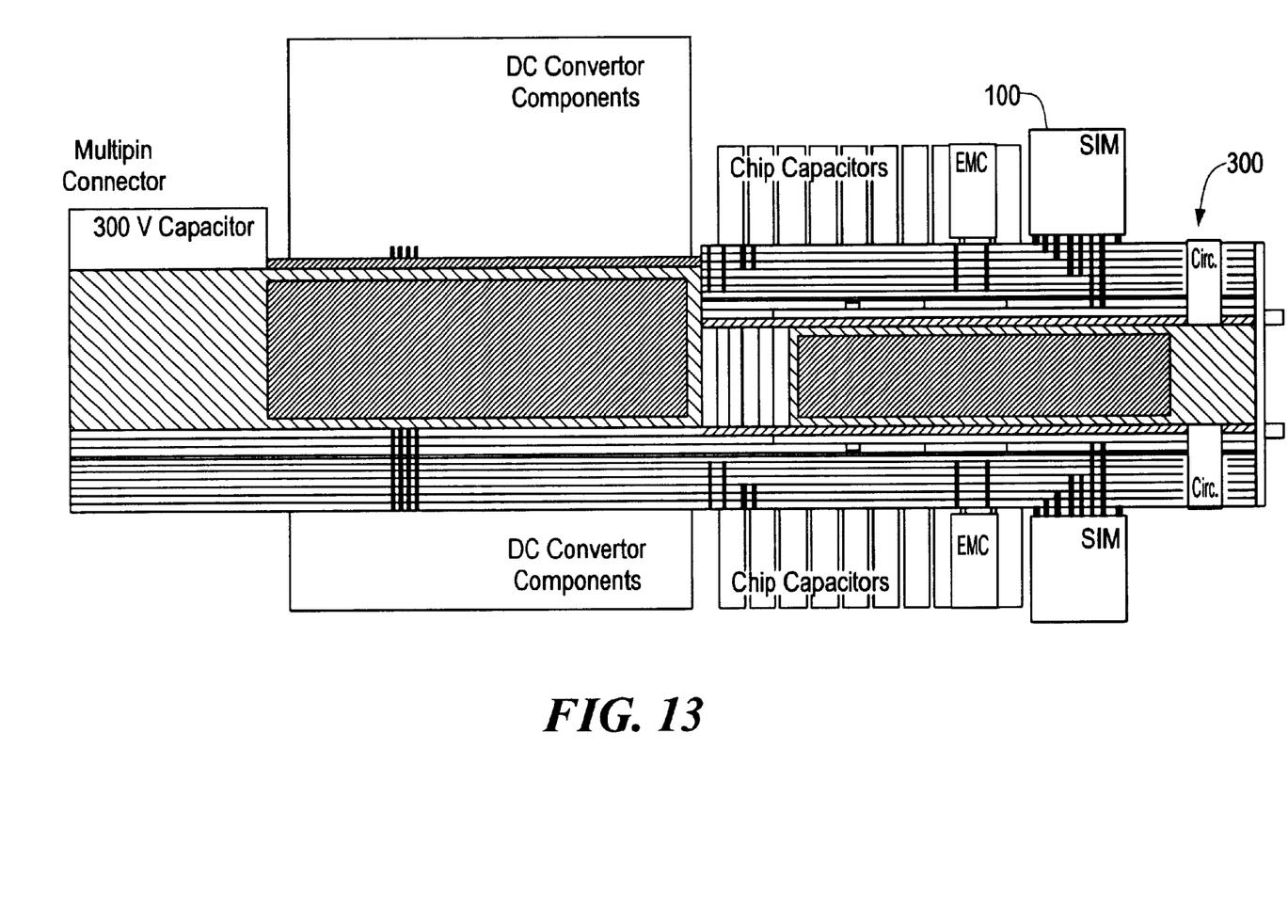
FIG. 13 is a schematic representation of a solid interface module in accordance with the present invention shown interfaced to a carrier.
Figure 13A:
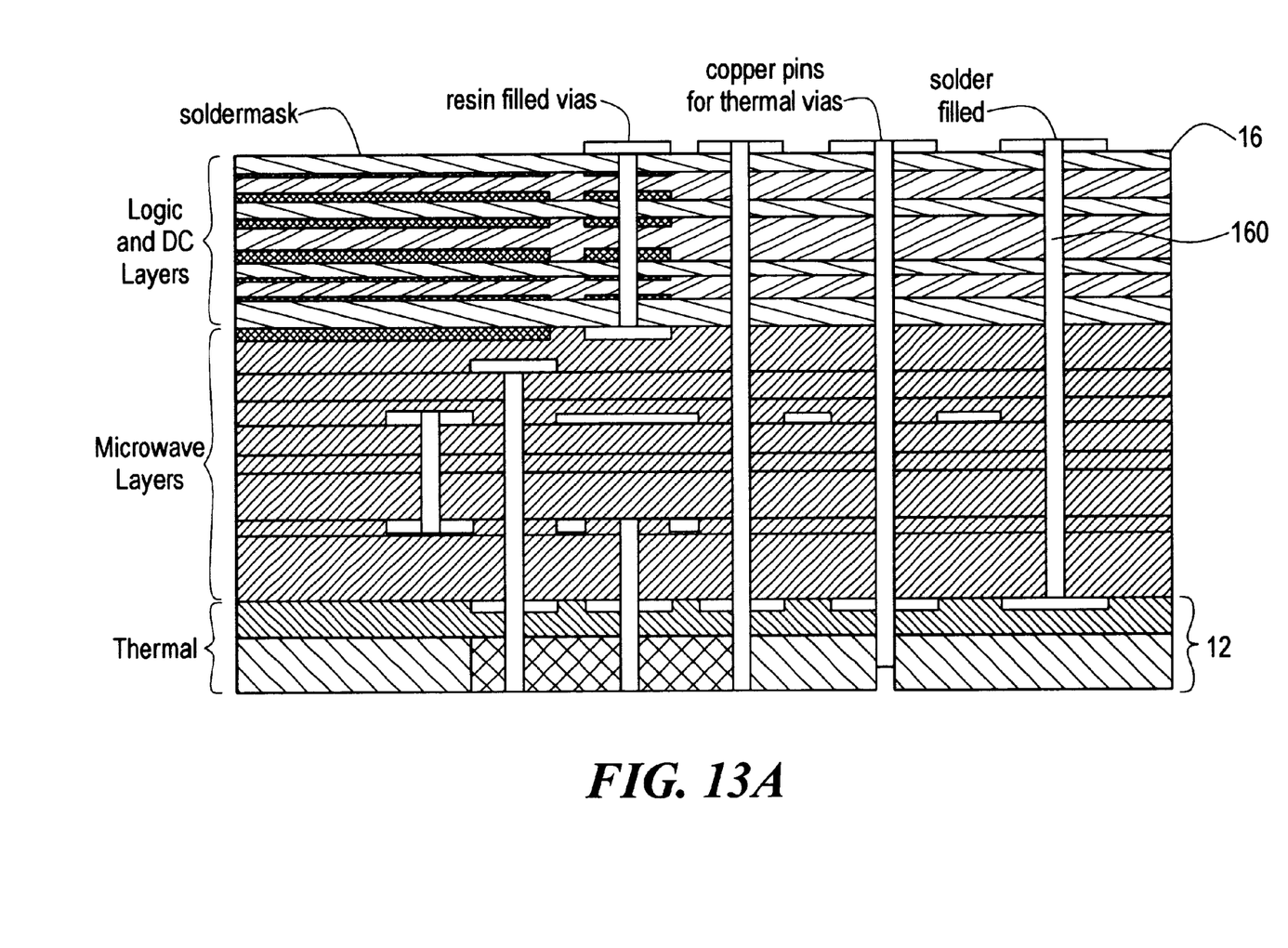
FIG. 13A is a schematic representation of a carrier to which a solid interface module in accordance with the present invention can be coupled.

The SIM of the present invention is well suited for being coupled to a variety of supporting modules. FIG. 13 shows an exemplary carrier 300 adapted for supporting at least one SIM. The module 300 is a line replaceable unit (LRU) incorporating multiple functions that were traditionally implemented with multiple discrete carriers, or boxes contained in a single housing and further incorporates multiple signal types, including DC, RF, and logic, with associated interconnections. The supporting carrier 300 utilizes a common carrier in the form of a multi-layer board that functions as a microwave multipurpose printed circuit board. The circuitry associated with each signal type is grouped together in a discrete area with keep out zones between the areas containing different signal types. Integration of circuitry processing different signal types in a single LRU provides a significant size, weight and cost reduction as compared to conventional transmit/receive assemblies FIG. 13A shows an alternative embodiment of a carrier to which a SIM in accordance with the present invention. The microwave signal carrying layers, the logic signal carrying layers, and the DC signal carrying layers are comprised of a plated dielectric material. In the illustrative embodiment, the microwave signal carrying layer and the logic signal carrying layers are comprised of Duroid and the logic signal carrying layers are comprised of Thurmount. In this particular embodiment, the Duroid has a relative dielectric constant of 2.3 and a coefficient of thermal expansion (CTE) on the order of 17 ppm °C. and Thermount has a CTE on the order of 7 ppm °C.

Preferably, the CTE of the core and exterior board layers (as well as the substrate of the SIM) are closely matched to that of the active components, such as to within 2 ppm °C. With this arrangement, the carrier is constrained (i.e., deformation is minimized). The purpose of matched CTEs is to constrain the structure near the interface to the active components allowing layers furthest from the interface wider range in the selection of dielectric and conductive materials.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:
1. A circuit assembly, comprising:
   a solid interface module including
      a substrate; and
      a circuit disposed on the substrate;
   a multi-layer carrier having a thermally conductive core, the solid interface module being disposed on the carrier; and
   a thermal via extending from the solid interface module to the conductive core.

2. The circuit assembly of claim 1, wherein the circuit includes a microwave circuit.

3. The circuit assembly of claim 2, wherein the microwave circuit includes a power amplifier.

4. The circuit assembly of claim 3, wherein the power amplifier is in proximity with the thermal via.

5. The circuit assembly of claim 2, wherein the solid interface module further includes a logic circuit disposed on the substrate.

6. The circuit assembly of claim 5, wherein the solid interface module further includes a DC bias circuit disposed on the substrate.

7. The circuit assembly of claim 2, further including a microwave launch structure extending from the microwave circuit.

8. The circuit assembly of claim 1, wherein the carrier further includes a metallic shell about the conductive core.

9. The circuit assembly of claim 8, wherein the conductive core includes TPG.

10. The circuit assembly of claim 1, wherein the solid interface module includes a plurality of BGA balls for interfacing with the carrier.

11. The circuit assembly of claim 10, wherein the thermal via includes a pin extending from a first one of the plurality of BGA balls to the conductive core.

12. The circuit assembly of claim 10, wherein the carrier includes a microwave signal layer.

13. The circuit assembly of claim 12, further including a signal via structure extending from a first one of the plurality of BGA balls to the microwave signal layer.

14. A circuit assembly, comprising:
   a solid interface module including
      a substrate; and
      a microwave circuit disposed on the substrate;
   a carrier having a plurality of signal layers including a microwave signal layer, the solid interface module being affixed to a surface of the carrier; and
   a first via structure extending from the solid interface module to the microwave signal layer.

15. The circuit assembly of claim 14, wherein the solid interface module includes a plurality of BGA balls interfacing with the carrier.

16. The circuit assembly of claim 15, wherein the first via structure includes a pin extending from a first one of the plurality of BGA balls to the microwave signal layer.

17. The circuit assembly of claim 14, wherein solid interface module includes a launch structure through the substrate for a microwave signal.

18. The circuit assembly of claim 14, wherein the solid interface module further includes a logic circuit disposed on the substrate.

19. The circuit assembly of claim 18, wherein the solid interface module further includes a DC bias circuit disposed on the substrate.

20. The circuit assembly of claim 14, wherein the microwave circuit includes a power amplifier.

21. The circuit assembly of claim 14, wherein the carrier further includes a thermally conductive core.

22. The circuit assembly of claim 21, wherein the thermally conductive core includes TPG.

23. The circuit assembly of claim 21, further including a second via structure extending from the solid interface module to the carrier core for dissipating heat.

24. The circuit assembly of claim 23, wherein the microwave circuit includes a power amplifier in proximity with the second via structure for dissipating heat to the carrier core.

25. The circuit assembly of claim 23, wherein the second via structure includes a pin extending from a second one of the plurality of BGA balls.

26. The circuit assembly of claim 14, wherein the solid interface module is a surface mount component.

27. A circuit assembly, comprising:

a solid interface module including
a substrate;
a plurality of BGA balls coupled to the substrate;
a microwave circuit disposed on the substrate; and
a logic circuit disposed on the substrate;

a carrier having a plurality of signal layers including a microwave signal layer and a logic signal layer; and a plurality of via structures including a first via structure extending from a first one of the plurality of BGA balls to the microwave signal layer.

28. The circuit assembly of claim 27, wherein the carrier further includes a thermally conductive core.

29. The circuit assembly of claim 27, wherein a second one of the plurality of via structures includes a thermal via extending from a second one of the plurality of BGA balls to the conductive core.

* * * * *

UNITED STATES PATENT AND TRADEMARK OFFICE
CERTIFICATE OF CORRECTION

PATENT NO. : 6,324,755 B1
DATED : December 4, 2001
INVENTOR(S) : Borkowski et al.

It is certified that error appears in the above-identified patent and that said Letters Patent is hereby corrected as shown below:

Column 1,
Line 37, delete "general , the" and replace with -- general, the --.
Line 37, delete "arc" and replace with -- are --.

Column 3,
Line 59, delete "can further includes" and replace with -- can further include --.

Column 4,
Line 32, delete "An examplary" and replace with -- In an exemplary --.
Line 34, delete "bellow" and replace with -- below --.
Line 36, delete "soldier balls" and replace with -- solder balls --.

Signed and Sealed this

Fourth Day of June, 2002

Attest:

Attesting Officer

JAMES E. ROGAN
Director of the United States Patent and Trademark Office